United States Patent
Pelley et al.

(10) Patent No.: US 9,466,394 B1
(45) Date of Patent: Oct. 11, 2016

(54) MISMATCH-COMPENSATED SENSE AMPLIFIER FOR HIGHLY SCALED TECHNOLOGY

(71) Applicant: FREESCALE SEMICONDUCTOR, INC., Austin, TX (US)

(72) Inventors: Perry H. Pelley, Austin, TX (US); Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/682,475

(22) Filed: Apr. 9, 2015

(51) Int. Cl.
  *G11C 29/02* (2006.01)
  *G11C 7/06* (2006.01)
  *H03F 3/45* (2006.01)
  *G11C 7/12* (2006.01)
  *G11C 7/08* (2006.01)

(52) U.S. Cl.
  CPC .............. *G11C 29/026* (2013.01); *G11C 7/06* (2013.01); *G11C 7/065* (2013.01); *G11C 7/08* (2013.01); *G11C 7/12* (2013.01); *G11C 29/028* (2013.01); *H03F 3/45179* (2013.01); *G11C 2207/06* (2013.01); *H03F 2200/375* (2013.01); *H03F 2200/462* (2013.01); *H03F 2200/87* (2013.01)

(58) Field of Classification Search
  CPC ..... G11C 7/06; G11C 7/065; G11C 2207/06; G11C 29/026; G11C 29/028
  See application file for complete search history.

(56) References Cited

U.S. PATENT DOCUMENTS

| | | | |
|---|---|---|---|
| 4,809,225 A | 2/1989 | Dimmler et al. | |
| 4,980,859 A | 12/1990 | Guterman et al. | |
| 5,349,302 A | 9/1994 | Cooper | |
| 6,084,799 A | 7/2000 | Tanzawa et al. | |
| 6,625,056 B1 | 9/2003 | Kihara | |
| 6,847,568 B2 | 1/2005 | Gogl et al. | |
| 6,980,459 B2 | 12/2005 | Seshadri et al. | |
| 7,079,415 B2 | 7/2006 | Frey | |
| 7,113,437 B2 | 9/2006 | Schweickert et al. | |
| 7,868,663 B2 * | 1/2011 | Oh | H04L 7/0337 327/307 |

(Continued)

FOREIGN PATENT DOCUMENTS

| | | |
|---|---|---|
| JP | 60144977 A | 7/1985 |
| JP | 1927276 C | 7/1986 |

(Continued)

OTHER PUBLICATIONS

Miyahara, M. et al., "A Low-Noise Self-Calibrating Dynamic Comparator for High-Speed ADCs", IEEE Asian Solid State Circuits Conference, Nov. 3-5, 2008, pp. 269-272.

Choudhary, A., "A Process Variation Tolerant Self-Compensation Sense Amplifier Design", http://scholarworks.umass.edu/cgi/viewcontent.cgi?article=1253&context=theses, University of Massachusetts—Amherst, Masters Theses, Sep. 2008, 107 pages.

(Continued)

*Primary Examiner* — Vanthu Nguyen

(57) ABSTRACT

Circuits and methods are provided for compensating an offset voltage measured between a first transistor and a second transistor of a sense amplifier circuit that is configured to sense a bit line signal during a sensing phase. The first transistor and the second transistor are cross-coupled. The first transistor is coupled to a first capacitor and the second transistor is coupled to a second capacitor. The first capacitor is further coupled to the second capacitor, and the first and second capacitors are coupled to a third transistor. The first capacitor applies a first bias voltage to the first transistor during a pre-sensing phase prior to the sensing phase, and the second capacitor applies a second bias voltage to the second transistor during the pre-sensing phase.

17 Claims, 3 Drawing Sheets

(56) References Cited

U.S. PATENT DOCUMENTS

| | | | |
|---|---|---|---|
| 8,493,806 B1 | 7/2013 | Chen | |
| 8,638,599 B2 | 1/2014 | Akiyama | |
| 9,202,543 B2 * | 12/2015 | Boujamaa | G11C 7/14 |
| 2005/0122762 A1 | 6/2005 | Lim et al. | |
| 2006/0203550 A1 | 9/2006 | Lee | |
| 2011/0216571 A1 | 9/2011 | Yamazaki et al. | |
| 2015/0016183 A1 * | 1/2015 | Sinangil | G11C 7/065 365/156 |

FOREIGN PATENT DOCUMENTS

| | | |
|---|---|---|
| JP | 2002109875 | 4/2002 |
| JP | 2011081896 A | 4/2011 |
| KR | 20020002823 A | 1/2002 |
| WO | 0051131 A1 | 8/2000 |
| WO | 2006121497 A2 | 11/2006 |

OTHER PUBLICATIONS

Groeneveld, S., "Offset Correction Techniques for Voltage Sense Amplifiers", http://eprints.eemcs.utwente.nl/8798/, University of Twente, Master Thesis, Aug. 2006, 72 pages.

Abe, K., et al. "Novel Hybrid DRAM/MRAM Design for Reducing Power of High Performance Mobile CPU", IEEE International Electron Devices Meeting (IEDM), pp. 10.5.1-10.5.4, Dec. 10-13, 2012.

U.S. Appl. No. 14/572,780, Pelley, et al., "Non-Volatile memory Using Bi-Directional Resistive Elements and Capacitive Elements", filed Dec. 17, 2014.

Notice of Allowance dated Nov. 4, 2015 in U.S. Appl. No. 14/572,780.

Non-final office action dated Jun. 17, 2016 in U.S. Appl. No. 14/588,177.

* cited by examiner

US 9,466,394 B1

MISMATCH-COMPENSATED SENSE AMPLIFIER FOR HIGHLY SCALED TECHNOLOGY

BACKGROUND

1. Field

This disclosure relates generally to sense amplifiers, and more specifically, to mismatch-compensated sense amplifier for highly scaled technology.

2. Related Art

As technology scales to decreasing size, a mismatch of sense amplifier transistor pairs may become more difficult. A mismatch may occur as a result of variances in various manufacturing processes used in the production of various semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As technology nodes features grow smaller, difficulties associated with mismatched transistor pairs may be amplified. This may be particularly troublesome with regard to sense amplifier transistor pairs, and even more so with the implementation of FinFETs in these technology nodes. Mismatches may occur as a result of variances in various manufacturing processes used in the production of various semiconductor devices. For example, one transistor of a pair may have a significantly different threshold voltage (e.g., $V_T$) than the other transistor in a pair. This disparity may be even more pronounced with FinFETs given the greater variance in typical manufacturing processes. As described in more detail below with reference to FIGS. 1-4, a capacitor may be placed in series with each of the cross-coupled transistors of a sense amplifier may be used to compensate for such a mismatch. Capacitors may be used to create a bias voltage at each transistor in order to balance the mismatched threshold voltage.

Figure 1:
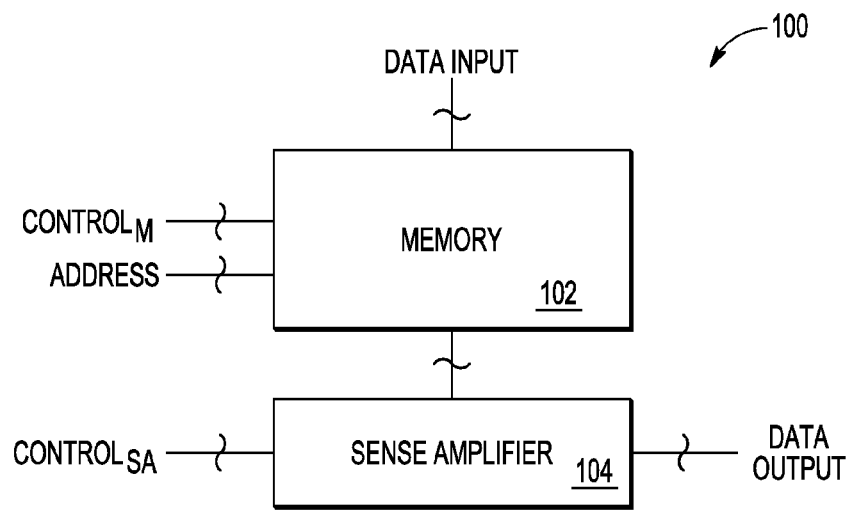
FIG. 1 illustrates an example memory device including a memory coupled to a sense amplifier, in accordance with certain embodiments of the present disclosure.

FIG. 1 illustrates an example memory device 100 including a memory 102 coupled to a sense amplifier 104, in accordance with certain embodiments of the present disclosure. In some embodiments, memory device 100 may be any appropriate memory device for use in any appropriate semiconductor device. For example, memory device 100 may be implemented as part of a SRAM memory implementation. Memory device 100 may include memory 102 which may, in some embodiments, include a plurality of memory storage elements operable to store information as part of memory device 100. For example, memory 102 may include a plurality of transistors configured to store data as part of memory device 100.

In some embodiments, memory 102 may be coupled to a plurality of data input signals. The plurality of data input signals may be operable to provide the data to be stored in memory 102 as part of the operation of memory device 100. Memory 102 may also be coupled to a plurality of control signals (e.g., Control$_M$), as well as to a plurality of address signals. The plurality of control signals may be operable to provide various control signals to memory 102 in order to facilitate various memory operations associated with memory device 100. The plurality of address signals may be operable to provide information to memory 102 in order to direct the appropriate portion of memory 102 to which the data received from the plurality of data input signals.

In some embodiments, memory 102 may be coupled to one or more sense amplifier(s) 104. Sense amplifier 104 may be operable to receive one or more signals from all or a portion of memory 102 and amplify that one or more signals such that the amplified signal(s) may be coupled to one or more data output signals and communicated to other portions of memory device 100 or other portions of a semiconductor device. For example, the components of memory 102 may be configured to output data at relatively low voltage. This relatively low voltage may not be usable by other components of memory device 100. Thus, the signal(s) received from memory 102 may be sensed at sense amplifier 104, amplified, and output to other components of memory device 100.

In some embodiments, sense amplifier 104 may also be coupled to one or more control signals (e.g., Control$_{SA}$). As described in more detail below with reference to FIGS. 2-4, these control signals may be operable to enable one or more mismatch-compensating operations associated with the operation of sense amplifier 104.

Figure 2:
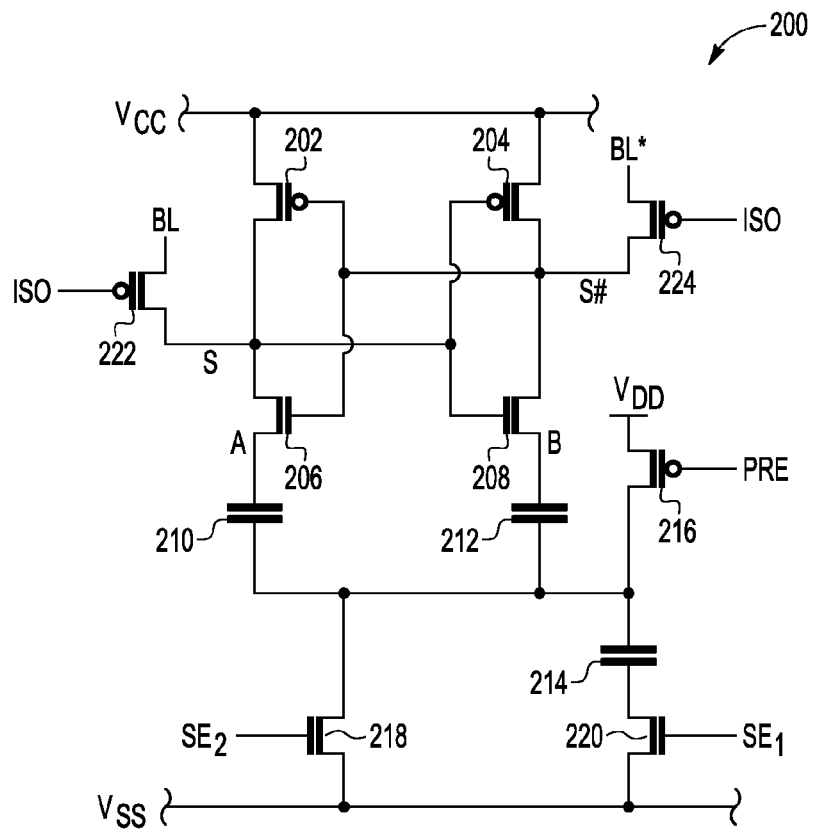
FIG. 2 illustrates an example configuration of sense amplifier, in accordance with certain embodiments of the present disclosure.

FIG. 2 illustrates an example configuration of sense amplifier 200, in accordance with certain embodiments of the present disclosure. Generally, sense amplifier 200 corresponds to sense amplifier 104. In some embodiments, sense amplifier 104 may include a plurality of sense amplifiers 200; in the same or alternative embodiments, sense amplifier 104 may include other components not illustrated in FIG. 2. For example, sense amplifier 104 may include voltage and/or current control circuitry.

In some embodiments, sense amplifier 200 may include one or more cross-coupled transistor pairs as part of a sense amplification scheme. Sense amplifier 200 may include first transistor 202 of a first type, second transistor 204 of the first type, third transistor 206 of a second type, and fourth transistor 208 of the second type cross coupled. In some embodiments transistor 206,208 may be depletion transistors of the second type. For example, first transistor 202 may include a first current electrode coupled to a first current source (e.g., $V_{CC}$), a second current electrode coupled to a node S, and a control electrode coupled a node S$^\#$. Second transistor 204 may include a first current electrode coupled to the first current source (e.g., $V_{CC}$), a second current electrode coupled to node S$^\#$, and a control electrode coupled to node S. Third transistor 206 may include a first current electrode coupled to node S, a control electrode coupled to node S$^\#$, and a second current electrode coupled to a first terminal of capacitor 210 (node A), as described in more detail below. Fourth transistor 208 may include a first current electrode coupled to node S$^\#$, a control electrode coupled to node S, and a second current electrode coupled to a first terminal of capacitor 212 (node B), as described in more detail below.

In some embodiments, sense amplifier 200 may also include a plurality of isolation transistors 222, 224. Transistors 222, 224 may be operable to isolate a given bit cell or other data storage element. Transistors 222, 224 may be of the same or different types. For example, transistor 222 may be a p-type transistor with a first current electrode coupled to a bit line signal (e.g., BL), a second current electrode coupled to node S, and a control electrode coupled to a control signal associated with an isolation signal (e.g., ISO). Transistor 224 may be a p-type transistor with a first current electrode coupled to a second bit line signal (e.g., BL#), a second current electrode coupled to node S#, and a control electrode coupled to a control signal associated with the isolation signal (e.g., ISO). Although transistors 222, 224 are illustrated as receiving the same isolation signal, different isolation signals may be coupled to transistors 222, 224 without departing from the scope of the present disclosure.

In some embodiments, sense amplifier 200 may also include precharge transistor 216 operable to enable a precharge operation, as described in more detail below. For example, transistor 216 may be a p-type transistor with a first current electrode coupled to a second voltage source (e.g., $V_{DD}$), a second current electrode coupled to a first terminal of capacitor 214, as described in more detail below, and a control terminal coupled to a precharge signal (e.g., PRE). Although transistor 216 is illustrated as a particular transistor type, other transistor types may be used without departing from the scope of the present disclosure. For example in some embodiments additional transistors may be used to precharge nodes A and B. As described in more detail below and with reference to FIGS. 3-4, the precharge signal may be associated with an operation in which capacitors 210, 212 are precharged to an appropriate level in order to offset any threshold voltage mismatch associated with the transistor pairs (e.g., pair 206, 208).

Sense amplifier 200 may also include a plurality of capacitors 210, 212. In some embodiments, capacitors 210, 212 may be metal-insulator-metal ("MIM") capacitors or any other capacitor of an appropriate size and performance characteristics operable to hold a variable charge in order to offset any threshold voltage mismatch associated with the transistor pairs (e.g., pair 206, 208). Capacitor 210 may have a first terminal coupled to a second current electrode of transistor 210 (e.g., at A) and a second terminal coupled to a second terminal of capacitor 212. Capacitor 212 may have a first terminal coupled to a second current electrode of transistor 212 (e.g., at B) and a second terminal coupled to a second terminal of capacitor 210. The second terminals of capacitors 210, 212 may also be coupled to the second current electrode of transistor 216, a first terminal of capacitor 214, and a first current electrode of transistor 218.

In some embodiments, sense amplifier 200 may also include a plurality of sense enable transistors 218, 220 gated by enable signals (e.g., $SE_2$, $SE_1$). As described in more detail below with reference to FIGS. 3-4, transistors 218, 220 may be operable to enable sensing using the cross-coupled transistor pairs described in more detail above (e.g., transistors 202, 204, 206, 208). Transistor 220 may include a first current electrode coupled to the a first terminal of capacitor 214, a second current electrode coupled to a third voltage source (e.g., $V_{SS}$), and a control electrode coupled to a first sense enable signal (e.g., $SE_1$). Transistor 218 may include a first current electrode coupled to the second terminals of capacitors 210, 212, a second current electrode coupled to the third voltage source (e.g., $V_{SS}$), and a control electrode coupled to a second sense enable signal (e.g., $SE_2$). In some embodiments, sense amplifier 200 may also include capacitor 214 with a second terminal coupled to capacitors 210, 212, and a second current electrode of transistor 218 and a second terminal coupled to the first current electrode of transistor 220. Capacitor 214 may be any appropriate capacitor (e.g., a MIM capacitor) in order to facilitate the precharge of capacitors 210, 212 in association with an automatic determination of an appropriate voltage level associated with a mismatch compensation of a transistor pair (e.g., transistors 206, 208).

Figure 3:
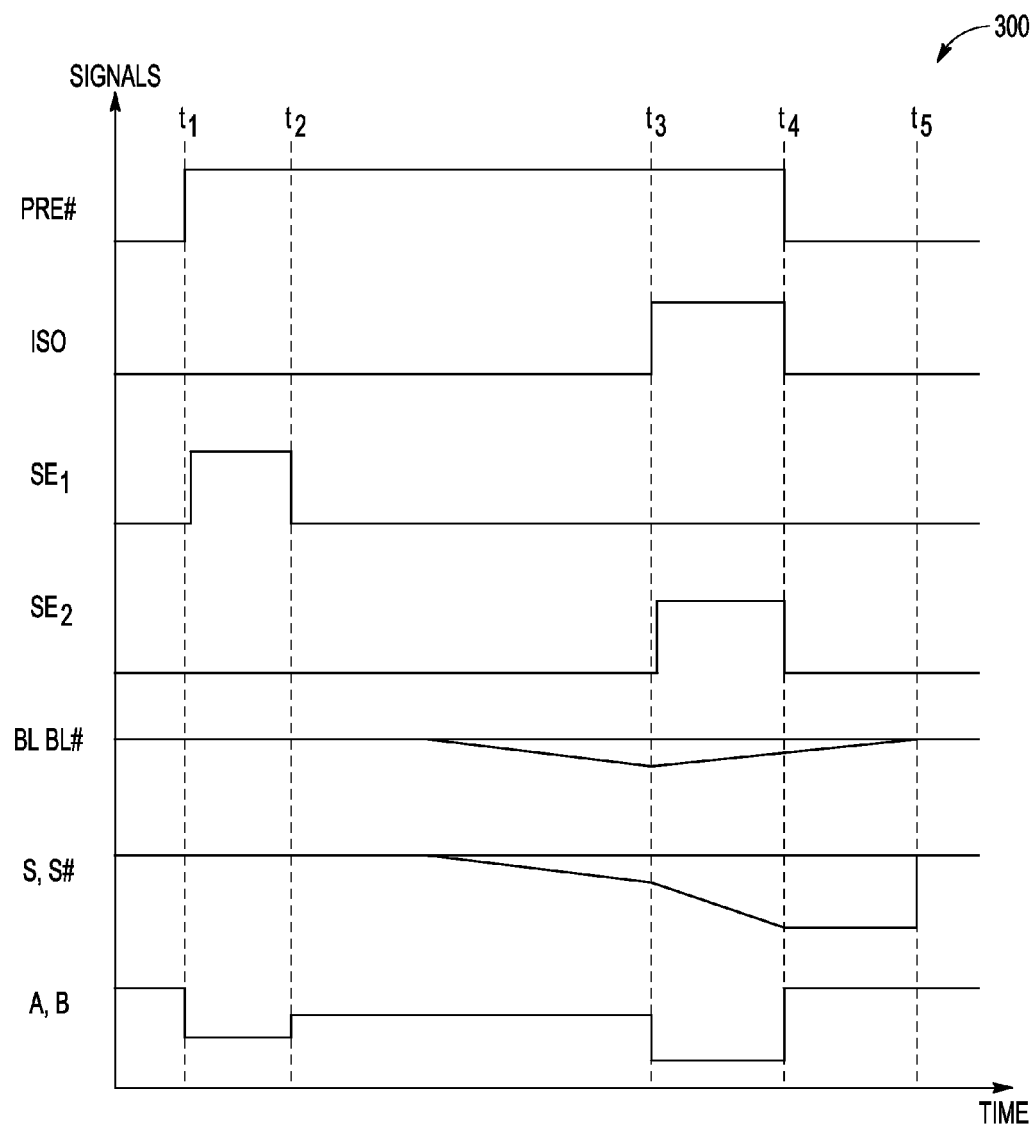
FIG. 3 illustrates an example timing diagram illustrating an example precharge time period associated with sense amplifier, in accordance with certain embodiments of the present disclosure.
Figure 4:
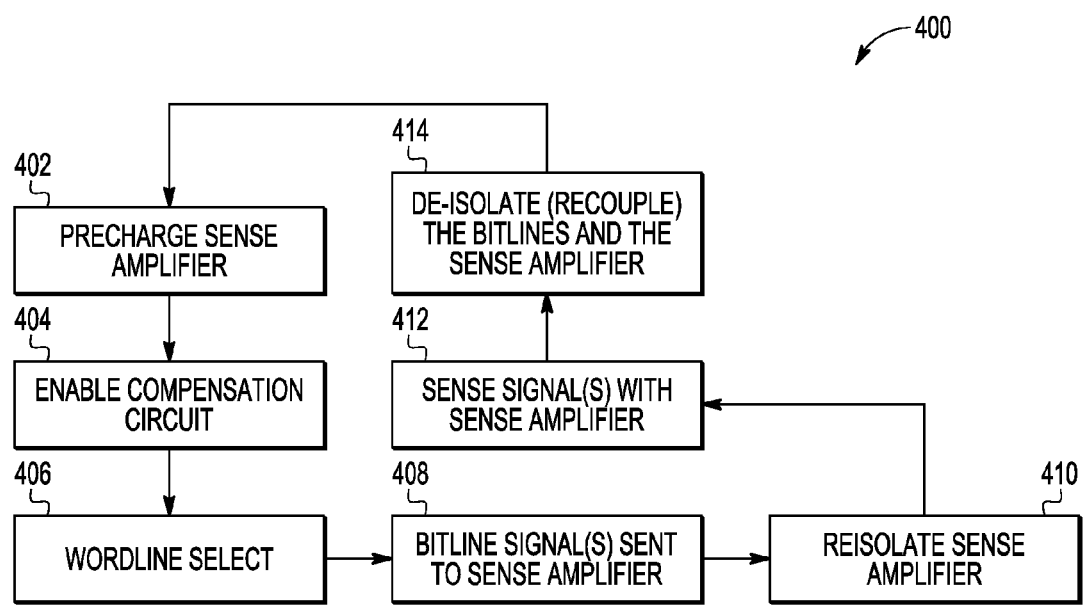
FIG. 4 illustrates an example flowchart of a method for precharging and sensing at a sense amplifier, in accordance with certain embodiments of the present disclosure.

The interoperation of the various components of sense amplifier 200 may be better understood with reference to FIGS. 3-4. Although certain components of sense amplifier 200 are illustrated and described with reference to FIG. 2, other components and/or groups of components may be implemented as part of sense amplifier 200 without departing from the scope of the present disclosure. For example, sense amplifier 200 may include a plurality of cross-coupled transistors associated with one set of offset capacitors 210, 212 (e.g., in deference to a design consideration). Other modifications may be made without departing from the scope of the present disclosure (e.g., changes in the number and/or types of control signals, types of transistors, etc.).

FIG. 3 illustrates an example timing diagram 300 illustrating an example precharge time period associated with sense amplifier 200, in accordance with certain embodiments of the present disclosure. Timing diagram 300 illustrates an example time period beginning at time $t_1$ and progressing through time $t_5$. At time $t_1$, the precharge signal goes inactive (e.g., in this configuration, the precharge signal PRE# is active low, and associated with p-type transistor 216; in other configurations the signal and/or transistor may be different without departing from the scope of the present disclosure). In Memory 100 other signals may be precharged during the precharge period or at other times. Also at time $t_1$, a first sense enable signal (e.g., $SE_1$) goes active for a time (e.g., from $t_1$ to $t_2$) initiating a pre-sense period.

At $t_1$, the isolation signal is in a first state (e.g., low), the second sense enable signal (e.g., $SE_2$) is in a first state (e.g., low), and the bit line signals (e.g., BL) are in a first state (e.g., high); S, S#, A, and B are in a first state (e.g. high). At time $t_2$, after the duration of the first sense enable signal, node A and/or node B may be at a relatively lower voltage level than at time $t_1$. In some embodiments, this is the result of a current path that has been established between the second voltage source (e.g., $V_{DD}$) and the third voltage source (e.g., $V_{SS}$) via capacitor 214 and transistor 220. As a result, the voltage at node A and/or node B may drop according to the relative threshold voltages of transistors 210, 212, respectively. This may result in capacitors 210, 212 charging to levels associated with the respective offset voltages of the respective transistors 210, 212. Between $t_2$ and $t_3$ a wordline (not shown) may be activated.

In response to the wordline, a data signal may be developed between bitline BL and BL#. Following this (e.g., from $t_3$ to $t_4$), the voltage levels at node S and/or node S# may adjust relative to the voltage level charged on the respective capacitors 210, 212. At time $t_3$ an isolation signal (e.g., ISO) may go to a second state (e.g., high), operating to isolate the sense amplifier transistor pairs from other portions of sense amplifier 104 and a second sense enable signal (e.g., SE2) may go to a second state (e.g., high).

At another time period (e.g., $t_3$ to $t_4$), the voltage level at node A or node B may go to a second state (e.g., low) as capacitors 210, 212 discharge through the path through transistor 218 to the third voltage source (e.g., $V_{SS}$). After a relatively short delay (e.g., at time $t_4$), the voltage level at node S, S# have been amplified to a voltage levels suitable to interface with other parts of memory 100 and/or other portions of a semiconductor device. Likewise by time $t_4$, the voltage levels at the bit line signals (e.g., BL, BL*) may have adjusted to a value operable to begin another memory cycle.

In some embodiments, at time $t_4$, the second sense enable signal (e.g., SE2) may return to a first state (e.g., low). At this point, capacitors 210, 212 may no longer be coupled to the third voltage source (e.g., $V_{SS}$). Additionally at time $t_4$ the isolation signal (e.g., ISO) may return to the first state (e.g., low), and the precharge signal (e.g., PRE#) may return to a first state (e.g., low) precharging the capacitors 210, 212, 214, the isolation signal (e.g., ISO) may go back to a first state (low) ending the isolation of the sense amplifier, and preparing sense amplifier 200 for another sensing cycle, as described in more detail below with reference to FIG. 4.

FIG. 4 illustrates an example flowchart of a method 400 for precharging and sensing at a sense amplifier, in accordance with certain embodiments of the present disclosure. Generally, method 400 may be performed within the components of sense amplifier 200. However, in some configurations, some or all of method 400 may be performed by other components of memory device 100 without departing from the scope of the present disclosure.

In some embodiments, method 400 includes 402-414. Although the description associated with FIG. 4 includes a starting point and an end point, method 400 may begin or end at any appropriate point without departing from the scope of the present disclosure. In some embodiments, method 400 begins at 402, where the sense amplifier is precharged. As described in more detail above with reference to FIGS. 1-3, the precharge may include a determination of the appropriate level at which to charge compensating capacitors associated with mismatched transistor pairs of a sense amplifier. The capacitors may then be precharged. Once the sense amplifier is precharged (e.g., at 402), method 400 may proceed to 404 to enable a compensation circuit, At 404, a compensation circuit may be enabled. In some embodiments, this may include storing an offset associated with sensing transistors 206,208 on capacitors 210,212. After the enabling of the compensation circuit, method 400 may proceed to 406. At 406, a wordline may be selected. Once selected, method 400 may proceed to 408.

At 408, a low voltage data signal may be developed on the bitlines and in the sense amplifier. In some embodiments, capacitors 210, 212 may be MIM capacitors. Because a MIM capacitor may have much larger capacitance than the parasitic capacitance of nodes S or S#, the relative the offset of the sensing transistors (e.g., 206,208) may be preserved when data is supplied to the sense amplifier.

After signal(s) are supplied to the sense amplifier, method 400 may proceed to 410. At 410 the sense amplifier is isolated from the large capacitance of the bitlines. After isolating method 400 is ready to proceed to 412. where the signals developed in the sense amplifier are sensed by activating signal one or more signals (e.g., SE2). During sensing, the amplitude of the data signal is increased to a voltage level that can communicate with other parts of memory 102 and/or other components of integrated circuit 100. As described in more detail above with reference to FIGS. 2-3, sensing may involve capacitors 210, 212, and transistor 220. Once data signals are amplified in the sense amplifier, method 400 may proceed to 414.

In some embodiments, at 414, sense amplifier 200 may be de-isolated (recoupled) to the bitlines in preparation for completing the cycle by returning to 402. Although certain processes are described with respect to method 400 and such processes may be described in a certain order, method 400 may proceed in any appropriate order, and method 400 may include more, fewer, and/or different processes than those described in FIG. 4. For example, FIG. 4 describes method 400 returning to 402 from 414. In some embodiments, however, sense amplifier 200 may not begin a precharge operation until a certain control signal is received. As an additional example, FIG. 4 illustrates 406 completing prior to method 400 proceeding to 408. In some embodiments, some or all of 404, 406 may proceed simultaneously.

By now it should be appreciated that there has been provided systems and methods for providing a mis-match compensated sense amplifier for highly scaled technology. Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, signals may be combined and/or split; transistors may be of different types; and/or more and/or different configurations of the transistor pairs comprising sense amplifier 200 may be present without departing from the scope of the present disclosure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

By now it should be appreciated there has been provided an integrated circuit. The circuit may include a memory having a plurality of memory cells; and a sense amplifier coupled to the memory, the sense amplifier configured to sense a bit line signal selected from the plurality of memory cells during a sensing phase. The sense amplifier may include: a first transistor (206) having a control electrode coupled with a first current electrode of a second transistor (208), the second transistor having a control electrode coupled with a first current electrode of the first transistor; a first capacitor (210) having a first electrode coupled to a second current electrode of the first transistor (206), wherein the first capacitor (210) is configured to apply a first bias voltage (A) to the second current electrode of the first transistor (206) during a pre-sensing phase prior to the sensing phase; a second capacitor (212) having a first electrode coupled to a second current electrode of the second transistor (208), the second capacitor (212) having a second electrode coupled to a second electrode of the first capacitor (210), wherein the second capacitor (212) is configured to apply a second bias voltage (B) to the second electrode of the second transistor (208) during the pre-sensing phase; and the first and second bias voltages are configured to compensate an offset voltage measured between the first and second transistors; and a third transistor (220 or 218) coupled between the second electrodes of the first and second capacitors and a first power supply voltage (Vss).

In some embodiments, the first and second bias voltages are respectively applied to the first and second transistors to equalize a first current passed by the first transistor and a second current passed by the second transistor during the pre-sensing phase. In the same or alternative embodiments, a precharge transistor (216) coupled between the second electrodes of the first and second capacitors (210 and 212) and a second power supply voltage (Vdd), the precharge transistor configured to precharge the first and second capacitors to the second power supply voltage (Vdd) during a pre-charging phase prior to the pre-sensing phase. In such embodiments, the first transistor (206) has a first threshold voltage, the second transistor (208) has a second threshold voltage, and the third transistor (220) is configured to adjust a voltage stored on the first electrode of the first capacitor (210) to the first bias voltage subsequent to the pre-charging phase, wherein the first bias voltage is substantially the second power supply voltage (Vdd) reduced by the first threshold voltage, and adjust a voltage stored on the first electrode of the second capacitor (212) to the second bias voltage subsequent to the pre-charging phase, wherein the second bias voltage is substantially the second power supply voltage (Vdd) reduced by the second threshold voltage.

In some embodiments, the circuit may also include a fourth transistor (220, the fourth transistor being 218) coupled between the second electrodes of the first and second capacitors (210 and 212) and the first power supply voltage (Vss). In such configurations, a third capacitor (214) may be coupled between the second electrodes of the first and second capacitors (210 and 212) and the third transistor (220).

In some embodiments, the circuit may also include a fifth transistor (202) having a control electrode coupled to the control electrode of the first transistor (206), having a first current electrode coupled to the first current electrode of the first transistor (206), and having a second current electrode coupled to a second power supply voltage (Vcc); and a sixth transistor (204) having a control electrode coupled to the control electrode of the second transistor (208), having a first current electrode coupled to the first current electrode of the second transistor (208), and having a second current electrode coupled to the second power supply voltage (Vcc). In such configurations, the first transistor (206), the second transistor (208), and the third transistor (220 or 218) are of a first type of transistor, and the fourth transistor (202) and the fifth transistor (204) are of a second type of transistor.

In some embodiments, the circuit may also include a first isolation transistor (222) coupled between a bit line input (BL) and the sense amplifier; and a second isolation transistor (224) coupled between an inverse value of the bit line input (BL#) and the sense amplifier, wherein the first and second isolation transistors are configured to electrically isolate the sense amplifier from the memory prior to and subsequent to a portion of the sensing phase, wherein the bit line input and the inverse value of the bit line input are transferred to the sense amplifier during the portion of the sensing phase.

What is also disclosed is a sense amplifier circuit that may include a first transistor (206) of a first type having a first current electrode coupled to a first node (S), a second current electrode coupled to a first electrode of a first capacitor (210), and a control electrode coupled to a second node (S#), wherein the first capacitor (210) is configured to store a first bias voltage (A); a second transistor (208) of the first type having a first current electrode coupled to the second node (S#), a second current electrode coupled to a first electrode of a second capacitor (212), and a control electrode coupled to the first node (S), wherein the second capacitor (212) has a second electrode coupled to a second electrode of the first capacitor (210), the second capacitor (212) is configured to store a second bias voltage (B), and an offset voltage is measured between the first and second transistors; and a third transistor (220) of the first type having a first current and a second current electrode coupled to a first power supply voltage (Vss), and a control electrode coupled to a first sense enable signal (SE1).

In some embodiments, the sense amplifier circuit may also include a precharge transistor (216) of a second type having a source electrode coupled to a second power supply voltage (Vdd), a drain electrode coupled to the second electrodes of the first and second capacitors (210 and 212), and a control electrode coupled to a precharge control signal (PRE).

In some embodiment, the sense amplifier circuit may further include a third capacitor having a first electrode coupled to the second electrode of the first capacitor and the second electrode of the second capacitor, and having a second electrode coupled to a drain electrode of the third transistor.

In some embodiments, the sense amplifier circuit may also include a fourth transistor (218) of the first type having a drain electrode coupled to the second electrode of the first capacitor (210) and the second electrode of the second capacitor (212), a source electrode coupled to the first power supply voltage (Vss), and a control electrode coupled to a second sense enable signal (SE2). In such configurations, a third capacitor (214) may have a first electrode coupled to the second electrode of the first capacitor (210) and the second electrode of the second capacitor (212), and may have a second electrode coupled to a drain electrode of the third transistor (220).

In some embodiments, the sense amplifier circuit may also include a fifth transistor (202) of a second type having a source electrode coupled to a second power supply voltage (Vcc), having a drain electrode coupled to the first node (S), and having a control electrode coupled to the second node (S#); and a sixth transistor (204) having a source electrode coupled to the second power supply voltage (Vcc), having a drain electrode coupled to the second node (S#), and having a control electrode coupled to the first node (S).

In some embodiments, the sense amplifier circuit may also include a first isolation transistor (222) having a first current electrode coupled to a bit line input (BL), having a second current electrode coupled to the first node (S), and having a control electrode coupled to an isolation control signal (ISO); and a second isolation transistor (224) having a first current electrode coupled to an inverse value of the bit line input (BL#), having a second current electrode coupled to the second node (S#), and having a control electrode coupled to the isolation control signal (ISO).

What is also disclosed is a method that may include compensating (408) an offset voltage measured between a first transistor (206) and a second transistor (208) of a sense amplifier circuit, wherein the sense amplifier circuit is configured to sense a bit line signal during a sensing phase, the compensating is performed during a pre-sensing phase prior to the sensing phase, the first transistor and the second transistor are cross-coupled, the first transistor (206) is further coupled to a first capacitor (210), the second transistor (208) is further coupled to a second capacitor (212), the first capacitor is further coupled to the second capacitor, the first and second capacitors are further coupled to a third transistor (220 or 218) that is coupled to a first power supply voltage (Vss), and the compensating may include applying a first bias voltage (A) to the first transistor (206) during the pre-sensing phase, wherein the first bias voltage (A) is stored on the first capacitor (210) wherein the first bias voltage is substantially the second power supply voltage reduced by the threshold voltage of the first transistor; and applying a second bias voltage (B) to the second transistor (208) during the pre-sensing phase, wherein the second bias voltage (B) is stored on the second capacitor (212) wherein the second bias voltage is substantially the second power supply reduced by the threshold voltage of the second transistor.

In some embodiments, the method may also include pre-charging (402) a common node of the first capacitor (210) and the second capacitor (212) to a second power supply voltage (Vdd), wherein the pre-charging is performed during a pre-charging phase prior to the pre-sensing phase. In such configurations, the method may also include adjusting the second power supply voltage stored on the first capacitor (210) to the first bias voltage subsequent to the pre-charging phase, wherein the first bias voltage is substantially the second power supply voltage (Vdd) reduced by the first threshold voltage; and adjusting the second power supply voltage stored on the second capacitor (212) to the second bias voltage subsequent to the pre-charging phase, wherein the second bias voltage is substantially the second power supply voltage (Vdd) reduced by the second threshold voltage.

In some embodiments, the method may also include developing the bit line signal and transferring the signal to the sense amplifier in response to a word line selection (406), wherein the developing and transferring is performed subsequent to the compensating (408). In some embodiments, the method may also include isolating the amplifier from the bitline. In still further embodiments, the method may also include sensing (416) the bit line signal during the sensing phase; and amplifying the bit line signal.

What is claimed is:

1. An integrated circuit comprising:
a memory having a plurality of memory cells; and
a sense amplifier coupled to the memory, the sense amplifier configured to sense a bit line signal selected from the plurality of memory cells during a sensing phase, the sense amplifier including:
  a first transistor having a control electrode coupled with a first current electrode of a second transistor, the second transistor having a control electrode coupled with a first current electrode of the first transistor,
  a first capacitor having a first electrode coupled to a second current electrode of the first transistor, wherein
    the first capacitor is configured to apply a first bias voltage to the second current electrode of the first transistor during a pre-sensing phase prior to the sensing phase,
  a second capacitor having a first electrode coupled to a second current electrode of the second transistor, the second capacitor having a second electrode coupled to a second electrode of the first capacitor, wherein
    the second capacitor is configured to apply a second bias voltage to the second electrode of the second transistor during the pre-sensing phase, and
    the first and second bias voltages are configured to compensate an offset voltage measured between the first and second transistors,
  a third transistor coupled between the second electrodes of the first and second capacitors and a first power supply voltage,
  a fourth transistor coupled between the second electrodes of the first and second capacitors and the first power supply voltage, and
  a third capacitor coupled between the second electrodes of the first and second capacitors and the third transistor.

2. The integrated circuit of claim 1, wherein
the first and second bias voltages are respectively applied to the first and second transistors to equalize a first current passed by the first transistor and a second current passed by the second transistor during the pre-sensing phase.

3. The integrated circuit of claim 1, further comprising:
a precharge transistor coupled between the second electrodes of the first and second capacitors and a second power supply voltage, the precharge transistor configured to precharge the second electrodes of the first and second capacitors to the second power supply voltage during a pre-charging phase prior to the pre-sensing phase.

4. The integrated circuit of claim 3, wherein
the first transistor has a first threshold voltage,
the second transistor has a second threshold voltage, and
the third transistor is configured to
  adjust a voltage stored on the first electrode of the first capacitor to the first bias voltage subsequent to the pre-charging phase, wherein the first bias voltage is substantially the second power supply voltage reduced by the first threshold voltage, and
  adjust a voltage stored on the first electrode of the second capacitor to the second bias voltage subsequent to the pre-charging phase, wherein the second bias voltage is substantially the second power supply voltage reduced by the second threshold voltage.

5. The integrated circuit of claim 1, further comprising:
a fifth transistor having a control electrode coupled to the control electrode of the first transistor, having a first current electrode coupled to the first current electrode of the first transistor, and having a second current electrode coupled to a second power supply voltage; and
a sixth transistor having a control electrode coupled to the control electrode of the second transistor, having a first current electrode coupled to the first current electrode of the second transistor, and having a second current electrode coupled to the second power supply voltage.

6. The integrated circuit of claim 5, wherein
the first transistor, the second transistor, and the third transistor are of a first type of transistor, and
the fourth transistor, the fifth transistor, and the sixth transistor are of a second type of transistor.

7. The integrated circuit of claim 1, further comprising:
a first isolation transistor coupled between a first bit line and a first input of the sense amplifier, wherein the first input comprises the second current electrode of the first transistor;
a second isolation transistor coupled between a second bit line and a second input of the sense amplifier, wherein the second input comprises the second current electrode of the second transistor; and
wherein the first and second isolation transistors are configured to electrically isolate the sense amplifier from the first and second bitlines prior to a portion of a sensing phase.

8. A sense amplifier circuit comprising:
a first transistor of a first type having a first current electrode coupled to a first node, a second current electrode coupled to a first electrode of a first capacitor, and a control electrode coupled to a second node;
a second transistor of the first type having a first current electrode coupled to the second node, a second current electrode coupled to a first electrode of a second capacitor, and a control electrode coupled to the first node, wherein
the second capacitor has a second electrode coupled to a second electrode of the first capacitor;
a third transistor of the first type having a first current electrode and a second current electrode coupled to a first power supply voltage, and a control electrode coupled to a first sense enable signal, and
a third capacitor having a first electrode coupled to the second electrode of the first capacitor and the second electrode of the second capacitor, and having a second electrode coupled to a drain electrode of the third transistor.

9. The sense amplifier circuit of claim 8, further comprising:
a precharge transistor of a second type having a first current electrode coupled to a second power supply voltage, a second current electrode coupled to the second electrodes of the first and second capacitors, and a control electrode coupled to a precharge control signal.

10. The sense amplifier circuit of claim 8, further comprising:
a fourth transistor having a drain electrode coupled to the second electrode of the first capacitor and the second electrode of the second capacitor, a source electrode coupled to the first power supply voltage, and a control electrode coupled to a second sense enable signal.

11. The sense amplifier circuit of claim 8, further comprising:
a fifth transistor of a second type having a source electrode coupled to a second power supply voltage, having a drain electrode coupled to the first node, and having a control electrode coupled to the second node; and
a sixth transistor having a source electrode coupled to the second power supply voltage, having a drain electrode coupled to the second node, and having a control electrode coupled to the first node.

12. The sense amplifier circuit of claim 8, further comprising:
a first isolation transistor having a first current electrode coupled to a first bit line, having a second current electrode coupled to the first node, and having a control electrode coupled to an isolation control signal; and
a second isolation transistor having a first current electrode coupled to an a second bitline, having a second current electrode coupled to the second node, and having a control electrode coupled to the isolation control signal.

13. A method comprising:
compensating an offset voltage measured between a first transistor and a second transistor of a sense amplifier circuit, wherein
the sense amplifier circuit is configured to sense a bit line signal during a sensing phase,
the compensating is performed during a pre-sensing phase prior to the sensing phase,
the first transistor and the second transistor are cross-coupled,
the first transistor is further coupled to a first capacitor,
the second transistor is further coupled to a second capacitor,
the first capacitor is further coupled to the second capacitor,
the first and second capacitors are further coupled to a third transistor that is coupled to a first power supply voltage,
the first and second capacitors are further coupled to a third capacitor that is coupled to a drain electrode of the third transistor, and
the compensating comprises:
applying a first bias voltage to the first transistor during the pre-sensing phase, wherein the first bias voltage is stored on the first capacitor wherein the first bias voltage is substantially the second power supply reduced by the threshold voltage of the first transistor,
applying a second bias voltage to the second transistor during the pre-sensing phase, wherein the second bias voltage is stored on the second capacitor wherein the second bias voltage is substantially the second power supply reduced by the threshold voltage of the second transistor.

14. The method of claim 13, further comprising:
pre-charging a common node of the first capacitor and the second capacitor to a second power supply voltage, wherein the pre-charging is performed during a pre-charging phase prior to the pre-sensing phase.

15. The method of claim 13, further comprising:
developing the bit line signal and transferring the signal to the sense amplifier in response to a word line selection, wherein
the developing and transferring is performed subsequent to the compensating.

16. The method of claim 15 further comprising isolating the amplifier from the bitline.

17. The method of claim 16, further comprising:
sensing the bit line signal during the sensing phase; and
amplifying the bit line signal.

* * * * *